US006940724B2

(12) United States Patent
Divakar et al.

(10) Patent No.: US 6,940,724 B2
(45) Date of Patent: Sep. 6, 2005

(54) DC-DC CONVERTER IMPLEMENTED IN A LAND GRID ARRAY PACKAGE

(75) Inventors: Mysore Purushotham Divakar, San Jose, CA (US); David Keating, Limerick (IE); Antoin Russell, Co. Limerick (IE)

(73) Assignee: Power-One Limited (KY)

( * ) Notice: Subject to any disclaimer, the term of this patent is extended or adjusted under 35 U.S.C. 154(b) by 0 days.

(21) Appl. No.: 10/691,833

(22) Filed: Oct. 22, 2003

(65) Prior Publication Data

US 2004/0212074 A1 Oct. 28, 2004

Related U.S. Application Data

(63) Continuation-in-part of application No. 10/423,603, filed on Apr. 24, 2003.

(51) Int. Cl.[7] .................................... H05K 7/20

(52) U.S. Cl. ...................... 361/719; 361/760; 361/767; 361/768; 257/706; 257/786; 174/252

(58) Field of Search ............................ 361/704, 707, 361/717–719, 760, 767, 768, 782; 257/706, 707, 712; 174/16.1, 252; 165/80.3, 104.33

(56) References Cited

U.S. PATENT DOCUMENTS 5,019,941 A * 5/1991 Craft .......................... 361/704
5,708,566 A * 1/1998 Hunninghaus et al. ...... 361/704
6,212,071 B1 * 4/2001 Roessler et al. ............ 361/704
6,477,054 B1 * 11/2002 Hagerup ..................... 361/720
6,611,055 B1 * 8/2003 Hashemi ..................... 257/706
6,787,895 B1 * 9/2004 Jarcy et al. ................. 257/698
2002/0172025 A1 * 11/2002 Megahed et al. ........... 361/767

* cited by examiner

*Primary Examiner*—Boris Chervinsky
(74) *Attorney, Agent, or Firm*—O'Melveny & Myers LLP

(57) ABSTRACT

A semiconductor chip package that includes a DC—DC converter implemented with a land grid array (LGA) package for interconnection and surface mounting to a printed circuit board. The LGA package integrates all required active components of the DC—DC power converter, including a synchronous buck PWM controller, driver circuits, and MOSFET devices. In particular, the LGA package comprises a substrate having a top surface and a bottom surface, with a DC—DC converter provided on the substrate. The DC—DC converter including at least one power silicon die disposed on the top surface of the substrate. A plurality of electrically and thermally conductive pads are provided on the bottom surface of the substrate in electrical communication with the DC—DC converter through respective conductive vias. The plurality of pads include first pads having a first surface area and second pads having a second surface area, the second surface area being substantially larger than the first surface area. Heat generated by the DC—DC converter is conducted out of the LGA package through the plurality of pads.

17 Claims, 8 Drawing Sheets

DC-DC CONVERTER IMPLEMENTED IN A LAND GRID ARRAY PACKAGE

RELATED APPLICATION DATA

This is a continuation-in-part of copending application Ser. No. 10/423,603, filed Apr. 24, 2003, for DC—DC CONVERTER IMPLEMENTED IN A LAND GRID ARRAY PACKAGE.

BACKGROUND OF THE INVENTION

1. Field of the Invention

The present invention relates generally to a power supply implemented with microelectronic components. More specifically, an embodiment of the present invention integrates a high-current buck regulator into a land grid array (LGA) package in order to meet the demanding electrical and thermal requirements for a board-level distributed power architecture in a minimum footprint.

2. Description of Related Art

Electronic systems face significant challenges for further size reductions, component density and most importantly power density. Many obstacles need to be overcome to meet up to these challenges. Effective heat dissipation and its management coupled with low resistance and low inductance interconnect, combined with the need to provide a low cost package, are but a few of the many barriers.

A conventional power semiconductor package or module includes one or more power semiconductor dice. A power semiconductor die, such as a power MOSFET, has a bottom surface defining a drain contact or electrode, and a top surface that includes a first metallized region defining a source contact or electrode and a second metallized region defining a gate contact or electrode. In general, each power semiconductor die is electrically and thermally coupled to an external pad.

Power semiconductor packages or modules that contain DC—DC converters exist in the market today. Often, the product is packaged in a micro lead frame (MLF) that does not readily accommodate a large number of discrete passive components. Consequently, the discrete passive components must be located externally—reducing the effectiveness of the package in terms of size reduction. For example, circuits such as the boost circuit and compensation components are frequently located to the exterior of the product and consume additional board space.

DC—DC converters require a significant number of active and passive components. A conventional DC—DC converter requires power MOSFETs, control integrated circuits (IC's), components for setting the operation of the PWM controller, feedback compensation components, capacitive filter elements, charge pump components, and a power stage filter LC (inductor and capacitor) component. In some cases, a DC—DC converter may be comprised of as many as thirty components. These separately housed components occupy a significant amount of space on a printed circuit board (PCB). These components require careful layout and trace routing to avoid stray inductances that can result in poor performance, or in some cases, device failure.

It is desirable to reduce the board space required by the plurality of components and combine these components into a high density, singly packaged component that houses the key semiconductor devices and associated components as a building block for a DC—DC converter. It would be desirable not to include the output LC filter due to size and due to the fact that this filter is variable with output voltage. It is desirable that this single package minimize stray inductances, provide a high conductivity interconnection between components, provide a high conductivity low inductance path to external interconnect points, and provide an efficient method of transferring the heat internally generated by the converter to the external environment. It is also desirable that this package be low in cost.

SUMMARY OF THE INVENTION

The proposed invention resolves many of these issues by packaging a DC—DC converter in an LGA platform offering an opportunity to achieve a combination of component density, overall package size reduction, and very high power density.

One aspect of the present invention is to integrate a DC—DC converter into an LGA package. According to this aspect, power semiconductor dice, control semiconductor die, and discrete passive components are electrically and thermally coupled together and are mounted on a top surface of a substrate to form a DC—DC converter. The bottom of the package includes multiple external pads that form an LGA. All semiconductor dice are electrically and thermally coupled to respective external pads.

In particular, the LGA package comprises a substrate having a top surface and a bottom surface, with a DC—DC converter provided on the substrate. The DC—DC converter including at least one power silicon die disposed on the top surface of the substrate. A plurality of electrically and thermally conductive pads are provided on the bottom surface of the substrate in electrical communication with the DC—DC converter through respective conductive vias. The plurality of pads include first pads having a first surface area and second pads having a second surface area, the second surface area being substantially larger than the first surface area. Heat generated by the DC—DC converter is conducted out of the LGA package through the plurality of pads.

More specifically, the at least one power silicon die is substantially aligned with at least one of the second pads. The first pads may be substantially located in a peripheral region of the bottom surface, with the second pads substantially located in an interior region of the bottom surface. Alternatively, the first pads may be substantially located at a first side of the bottom surface, with the second pads substantially located at a second side of the bottom surface. The at least one semiconductor die may further include a first pair of MOSFET devices substantially aligned with a first corresponding pair of second pads disposed adjacent a first side of the bottom surface, and a second pair of MOSFET devices substantially aligned with a second corresponding pair of second pads disposed adjacent a second side of the bottom surface.

Another aspect of the present invention is to provide a thermally enhanced substrate. In one embodiment, the substrate includes multiple high density via arrays. Each high density via array is located directly beneath a power semiconductor die. In a preferred embodiment, each high density via array is electrically and thermally coupled to a power semiconductor die and an external pad of the LGA.

Still another aspect of the present invention is to provide a low electrical and thermal impedance path between a power semiconductor die and an external pad of the LGA. In one embodiment, the substrate is comprised of two layers—a die surface and a bottom surface. Each high density via array provides a direct electrical and thermal path between the die surface and the bottom surface. In another embodiment, the substrate is comprised of more than two layers, which are contained by a die surface and a bottom surface.

Another aspect of the present invention is to increase the thermal dissipation characteristics of the package. In one embodiment, a high density via array is electrically and thermally coupled to each semiconductor die. The high density via array optimizes the total number of vias that may be positioned under the semiconductor die (within the physical outline of the power semiconductor die). Each high density via array dissipates the heat generated by the semiconductor die more efficiently than conventional via arrays.

DETAILED DESCRIPTION OF THE PREFERRED EMBODIMENT

In general, the present invention integrates a DC—DC converter into an LGA package in order to meet the demanding electrical and thermal requirements for a board-level distributed power architecture in a minimum footprint. More particularly, the present invention provides a highly-efficient point-of-load DC—DC power converter adapted to deliver low voltages at high currents in close proximity to loads. The LGA package integrates all required active components of the DC—DC power converter, including a synchronous buck PWM controller, driver circuits, and MOSFET devices.

Figure 1:
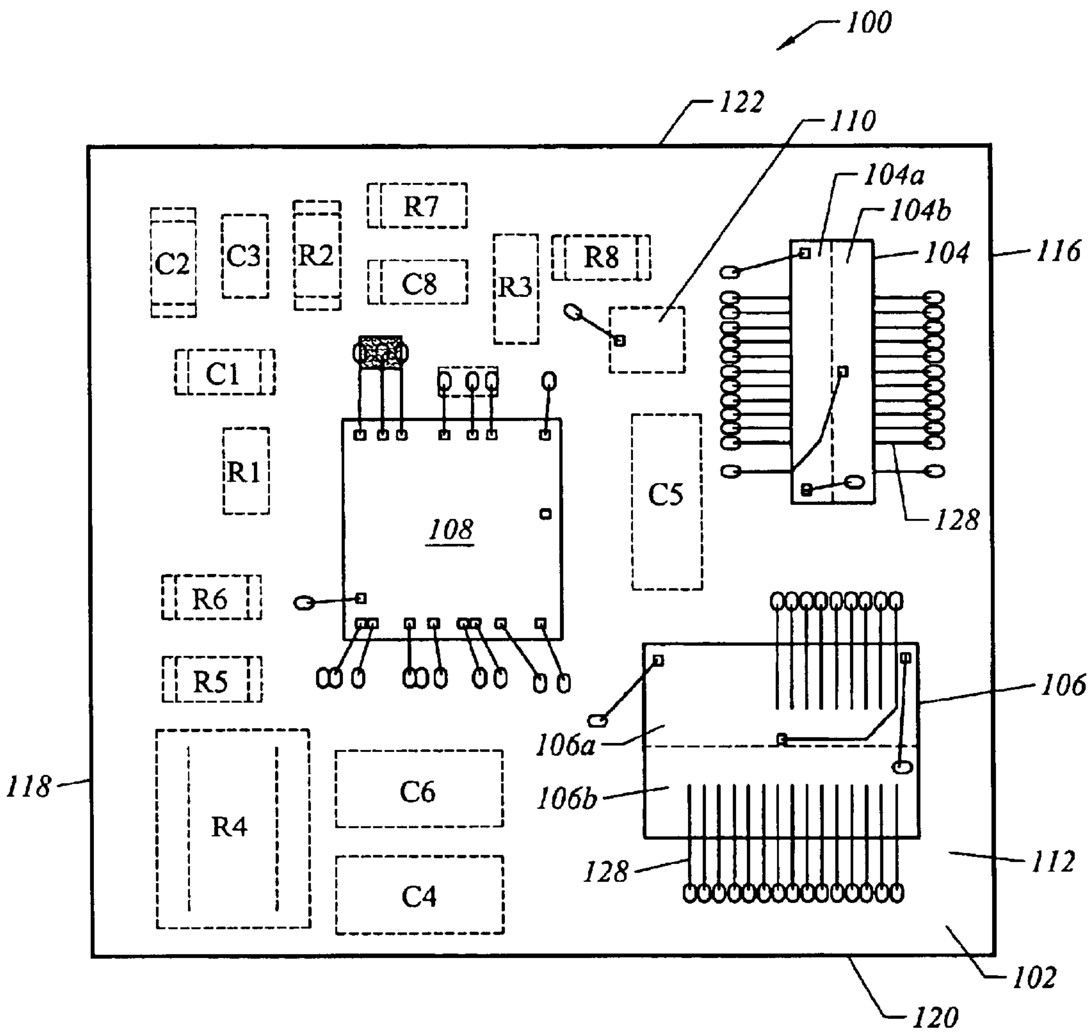
FIG. 1 is a top view of an embodiment of the present invention, illustrating the basic package components.
Figure 2:
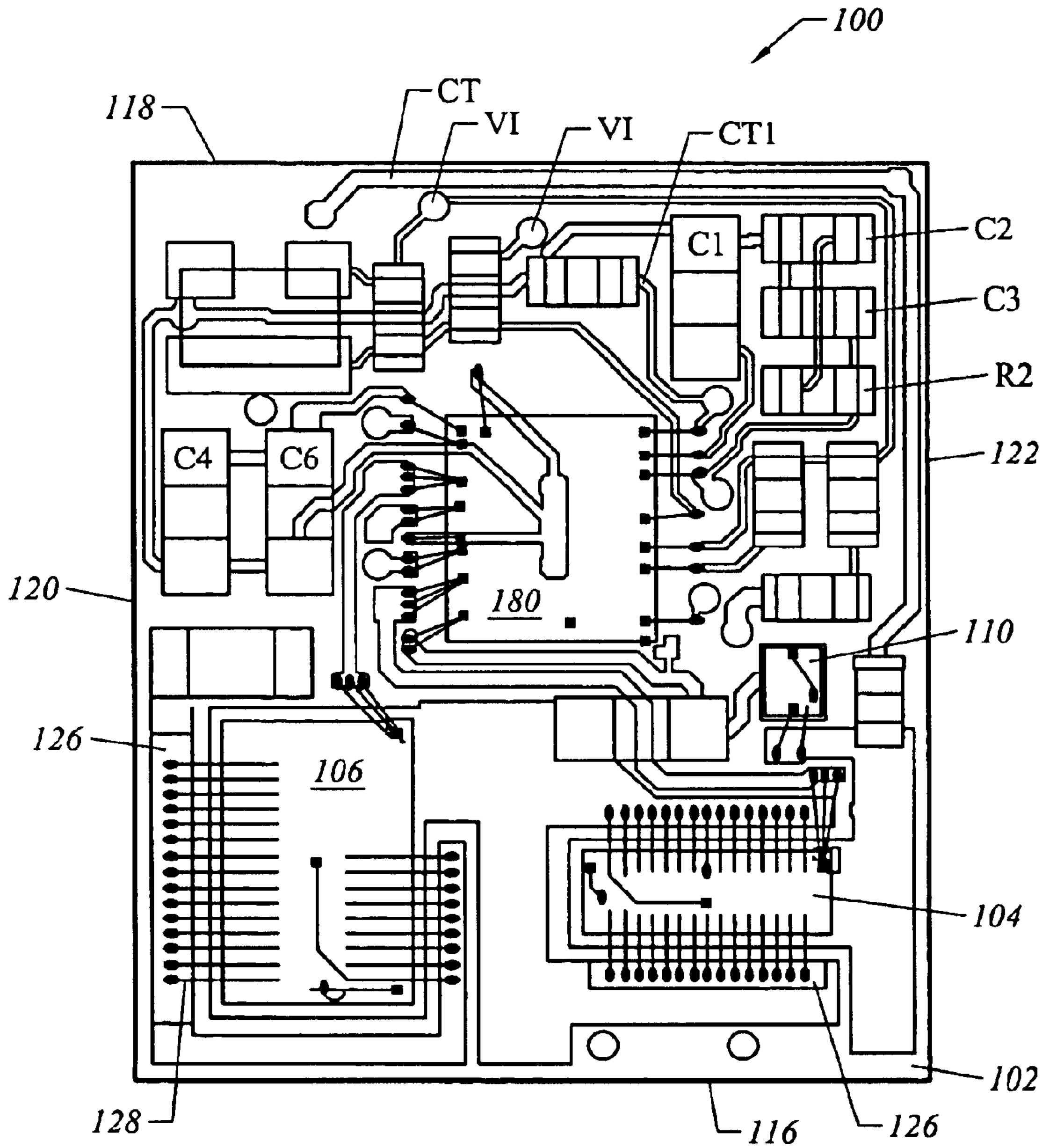
FIG. 2 is a top view of an embodiment of the present invention, illustrating the electrical interconnects between the components.

FIGS. 1–2 illustrate a top view of a power semiconductor package 100 according to one aspect of the present invention. The power semiconductor package 100 includes, among other components that will be discussed later, a substrate 102, a first power semiconductor die 104, a second power semiconductor die 106, a third semiconductor die 108, a fourth semiconductor die 110, and a plurality of discrete passive components (e.g., resistors R1–R8 and capacitors C1–C9). In a preferred embodiment, the four semiconductor dice 104, 106, 108, 110 and the discrete passive components are electrically coupled together to form a DC—DC converter. The number of discrete passive components mounted on the substrate 102 may vary according to the performance requirements of the package 100. It is also within the scope of the present invention for the package to only contain a portion of a DC—DC converter.

Figure 3:
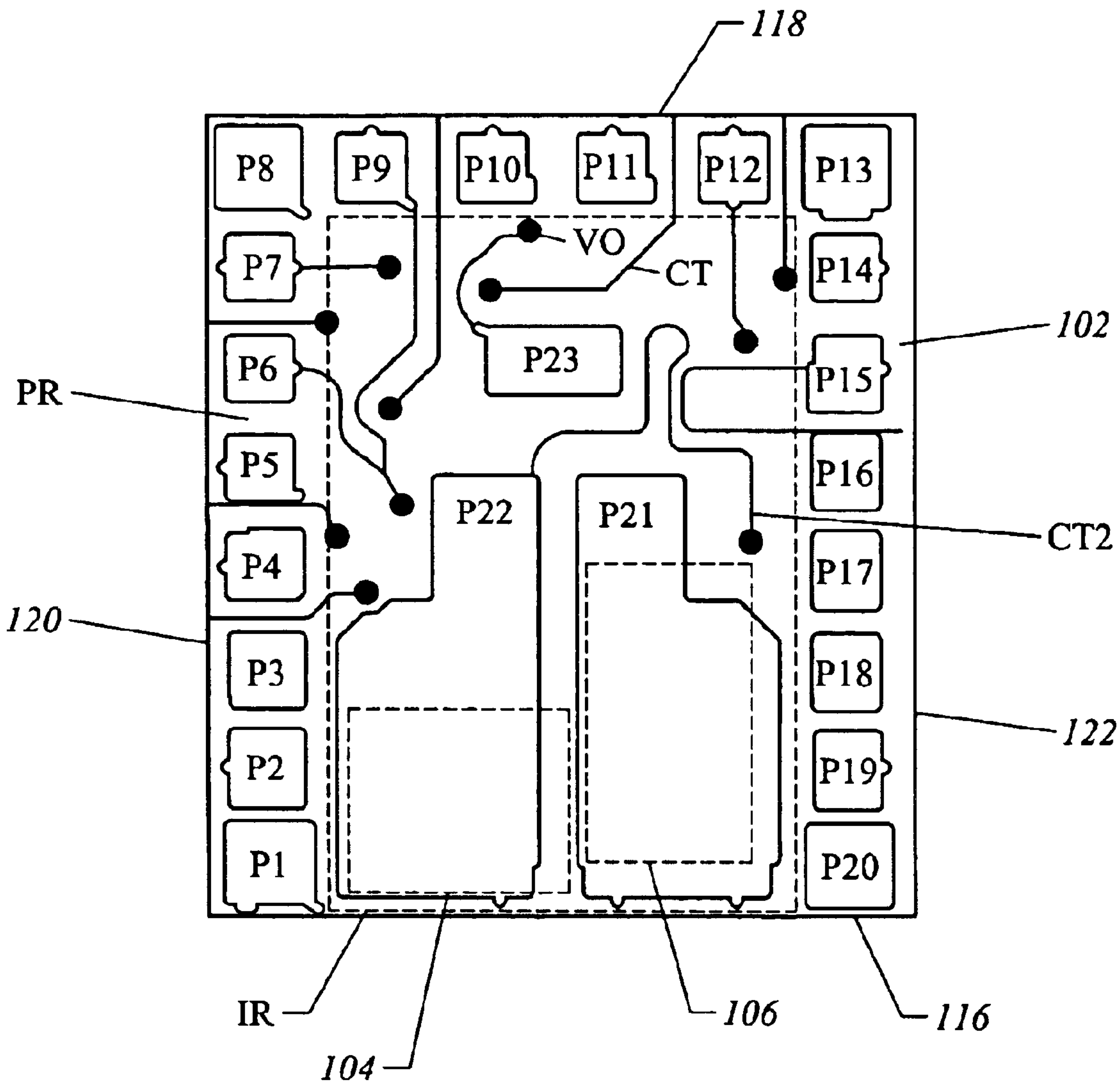
FIG. 3 is a bottom view of an embodiment of the present invention, illustrating the pin-out assignments of the LGA package.

The substrate 102 is preferably a two-layer substrate that includes a die surface 112 and a bottom surface 114 (see FIG. 3). The substrate 102 may also comprise multiple layers. The substrate 102 includes a periphery defined by first and second spaced apart side edges 116, 118 and front and rear peripheral edges 120, 122, respectively. The die surface 112 of the substrate 102 includes die attach pads that each power semiconductor die 104, 106 and semiconductor die 108, 110 mount to and lands for mounting each discrete passive component. Copper traces CT electrically connect the various discrete passive components and the four semiconductor dice 104, 106, 108, 110. The bottom surface 114 of the substrate 102 (see FIG. 3) includes multiple external conductive pads that form an LGA, which provides a surface mount interconnection to a printed circuit board.

FIG. 2 provides a more detailed illustration of the die surface 112 and the various electrical components mounted to it. The die surface 112 of the substrate 102 includes multiple copper traces CT that electrically connect the lands and pads (not shown) that the components (e.g., semiconductor dice, capacitors, and resistors) are mounted on. The copper traces CT also provide an electrical connection between the third semiconductor die 108 and the discrete passive components. For example, the copper trace CT1 electrically connects pin 8 of the third semiconductor die 108 and the discrete passive component resistor R1. The method of forming the copper traces CT on the substrate 102 is well known within the art and does not require further disclosure.

It is preferred that the power semiconductor dice 104, 106 be provided by power MOSFETs. The power semiconductor dice 104 (high-side MOSFET) and 106 (low-side MOSFET) each include a first metallized surface **104*a*, 106*a* (source electrode), a second metallized surface 104*b*, 106*b* (gate electrode), and an opposing metallized surface 104*c*, 106*c* (drain electrode). The first metallized surfaces 104*a*, 106*a* (source electrodes) and the second metallized surfaces 104*b*, 106*b* (gate electrodes) of the power semiconductor dice 104, 106 are connected to bond pads 126 on the die surface 112 of the substrate 102 by a plurality of bond wires 128. The opposing metallized surfaces 104*c*, 106*c* (drain electrode) of the power semiconductor dice 104, 106 are mounted to a die attach pad 130 (see FIG. 5). The power semiconductor dice 104, 106 are preferably mounted to a die attach pad 130 by thermally and/or electrically conductive die attach adhesive 132**.

The third semiconductor die 108 is preferably an integrated circuit ("IC") that provides a controller/driver for the DC—DC converter. The semiconductor die 108 is adhesively bonded to the die surface 112 of the substrate 102 and is also mounted on a die pad 130. For example, the semiconductor die 108 provides a gate drive to the first and second power semiconductor dice 104, 106. Additionally, the semiconductor die 108 provides pulse width modulation ("PWM") control of the second metallized surfaces **104*b*, 106*b* for the purpose of regulating the on time of the first and second power semiconductor dice 104, 106**.

The fourth semiconductor die 110 is preferably a diode. The fourth semiconductor die 110, in conjunction with a capacitor and a resistor, comprise a charge pump that supplies a boost voltage for the driver of the first power semiconductor die 104.

The physical placement of the semiconductor dice 104, 106, 108, 110 and the discrete passive components on the die surface 112 of the substrate 102 is intended to maximize the efficiency of the LGA package. The first and second power semiconductor dice 104, 106 are preferably adjacent or proximate to each other to minimize the interconnecting inductance between the two devices. The location of the third semiconductor die 108 with respect to the first and second power semiconductor dice 104, 106 minimizes the gate drive impedance associated with stray inductance.

Figure 4:
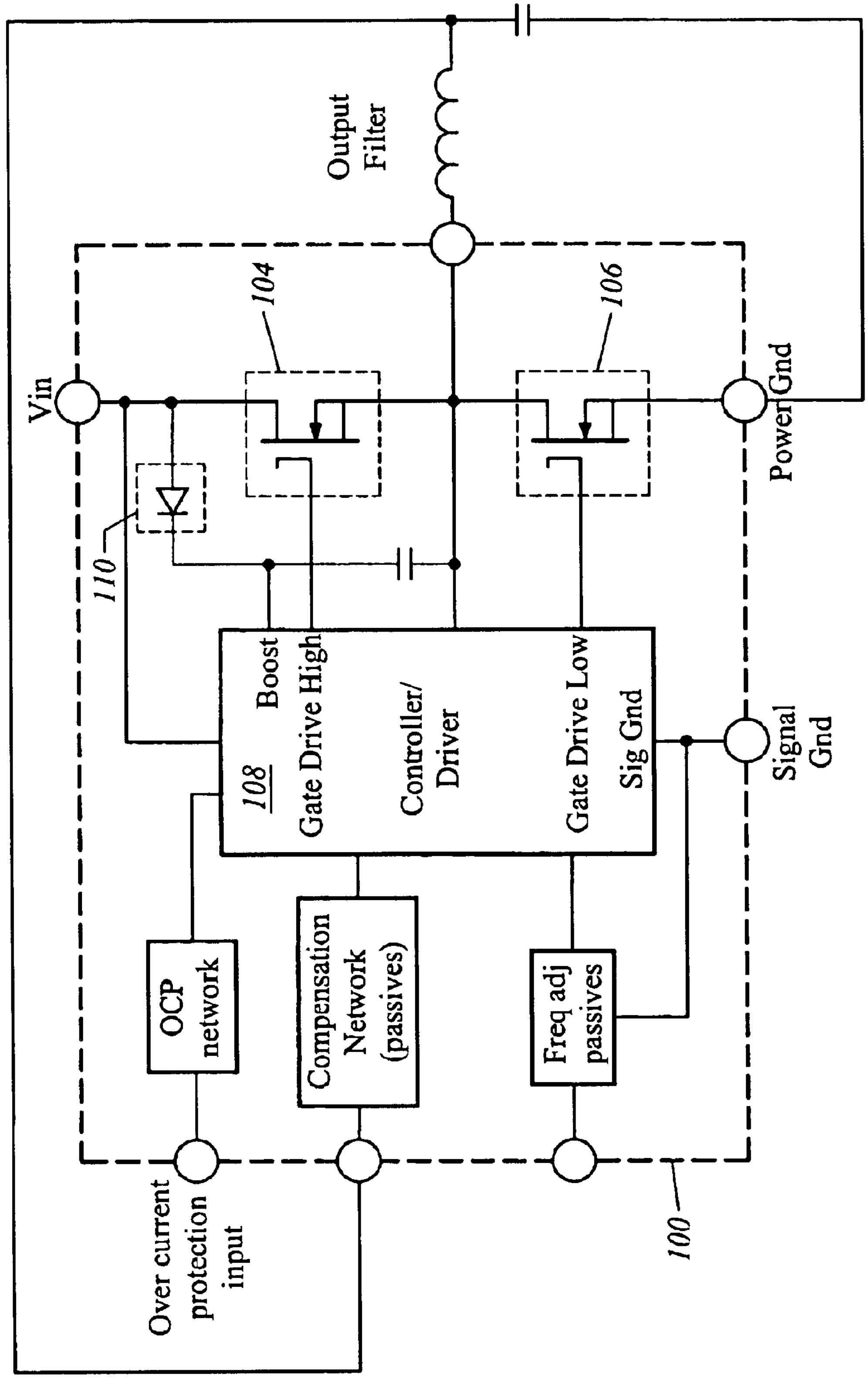
FIG. 4 is a schematic view of an embodiment of the present invention.

FIG. 4 illustrates an electrical diagram of one embodiment of the DC—DC converter provided in a LGA package 100. As shown in FIG. 4, the DC—DC converter comprises a conventional buck converter topology used to convert an input DC voltage $V_{in}$ to an output DC voltage $V_o$ applied to a resistive load (not shown). The DC—DC converter includes high side MOSFET 104, low side MOSFET 106, and an output filter provided by an inductor and capacitor. The drain terminal of the high side MOSFET 104 is coupled to the input voltage $V_{in}$, the source terminal of the low side MOSFET 106 is connected to ground, and the source terminal of the high side MOSFET 104 and the drain terminal of the low side MOSFET 106 are coupled together to define a phase node. The inductor of the output filter is coupled in series between the phase node and the terminal providing the output voltage $V_o$, and the capacitor of the output filter is coupled in parallel with the resistive load. The controller/driver provided by the third semiconductor die 108 includes a pulse width modulation (PWM) circuit that controls the duty cycle of a square wave signal used to control the activation time of the MOSFETs 104, 106. Feedback signals reflecting the output voltage $V_o$ and/or current are provided to the controller/driver via a suitable compensation network to determine the duty cycle of the PWM signal. The opening and closing of the MOSFETs 104, 106 provides an intermediate voltage having a generally rectangular waveform at the phase node, and the output filter formed by the inductor and capacitor converts the rectangular waveform into the substantially DC output voltage $V_o$. The DC—DC converter may also include an over current protection (OCP) network, and passive devices used to determine the clock frequency for the PWM circuit, as generally known in the art.

The location of the boost circuit components within the package is another aspect of the present invention. The boost circuit develops a voltage referenced to the first metallized surface 104*a* of the first power semiconductor die 104 and is of sufficient voltage to drive the second metallized surface 104*b*. Stray inductances can reduce the boost voltage and, therefore, the present invention minimizes the stray inductances in the circuit by including the boost circuit within the package. A filter capacitor is preferably located relative to the third semiconductor die 108 in order to provide a low impedance path for the conduction currents associated with the first and second power semiconductor dice 104, 106 when these devices are switched.

During operation, the majority of the heat created by the package is generated by the first and second power semiconductor dice 104, 106. This heat must be dissipated efficiently from the opposing sides 104*c*, 106*c* of the first and second power semiconductor dice 104, 106 to the external pads P1–P23 of the LGA. In view of the small size of the LGA package, it is expected that most of the thermal dissipation of the LGA package will go through the motherboard to which the LGA package is coupled. Accordingly, an efficient thermal design is paramount to successful operation. In addition, critical electrical paths require low parasitic impedances to maintain circuit performance.

Since the semiconductor dice contained within the LGA package have power dissipation rates that are dependent upon operating conditions, the thermal resistance parameters for the LGA package are optimally determined by considering all operating conditions for the DC—DC converter. The package junction temperature $T_J$, related thermal resistances, and thermal parameters are defined for the die having the most critical temperature. In the present DC—DC converter application, most of the power is dissipated by the high side switching MOSFET die 104, which is not located centrally within the package. Accordingly, a package temperature value $T_C$ is defined at a location corresponding to the position of the switching MOSFET die 104, and all measured and modeled package temperatures are referenced to this location. By ensuring that the temperature $T_C$ at this location does not exceed a predetermined maximum value, all other components of the LGA package will thereby remain within respective safe operating limits.

FIG. 3 illustrates a preferred embodiment of an LGA that is formed on the bottom surface 114 of the substrate 102. The LGA is generally divided into two regions—an interior region IR and a peripheral region PR. The interior region IR preferably encompasses the center portion of the substrate's bottom surface 114. The peripheral region PR surrounds the interior region IR and is defined by the remaining space on the bottom surface 114 located between the interior region IR and the four edges of the substrate 116, 118, 120, 122. It is within the scope and spirit of the present invention for the LGA to include other external pad arrangements.

The interior region IR includes external pads P21, P22, and P23. The peripheral region PR contains external pads P1–P20. As previously mentioned above, the package 100 is intended to provide a low thermal impedance path between each power semiconductor die and an external pad. The external pads P21, P22 are dedicated to the power semiconductor dice 104, 106. Thus, the external pads P21, P22 are the largest pads within the LGA since the first and second power semiconductor dice 104, 106 dissipate the most heat in the package. The large pads provide low thermal and electrical impedance connections to the motherboard. In a preferred embodiment, the external pad P22 is located substantially directly beneath the first power semiconductor die 104. In the embodiment that includes a two-layer substrate, the distance between the large input pad P22 and the opposing metallized surface 104*c* of the first power semiconductor die 104 is short (e.g., less than 1 mm). The short distance provides a low inductance path between the large input pad P22 and the opposing metallized surface 104*c*. The short path also includes high electrical conductivity properties in combination with a low stray interconnect inductance. The footprint of the power semiconductor die 104 is shown in FIG. 3 as a broken line to illustrate the physical location of the external pad P22 in relation to the power semiconductor die 104. The external pad P22 is positioned such that substantially all of the opposing metallized surface 104*c* is located directly above the external pad P22.

The large input pad P21 is located substantially directly beneath the second power semiconductor die 106. The location of the pad P21 provides a path containing similar electrical and thermal properties as the path between the large external pad P22 and the first power semiconductor die 104. The external pad P21 also provides a high conductivity path to an externally located output filter (not shown) and a high thermal conductivity path from the opposing metallized surface 106*c* of the second power semiconductor die 106 to the external environment of the package. The external pads P1–P20 are dedicated for use by the discrete passive components. The footprint of the power semiconductor die 106 is shown in FIG. 3. The physical location of the external pad P21 is such that substantially all of the power semiconductor die 106 is positioned directly over the external pad P21. It is within the scope and spirit of the invention to have a smaller portion of the semiconductor dice 104, 106 positioned directly over the external pads P22, P22 respectively.

In a preferred embodiment, the LGA package provides at least the following combination of I/O pads: power converter enable; frequency trim; output voltage trim; Vcc of the second power semiconductor die 106; overcurrent protection input; and junction connection of the source of the first power semiconductor die 104 and the opposing metallized surface 106*c* of the second power semiconductor die 106. In one embodiment, the I/O pin assignments, which correlate with the external pad designations, are as follows:

TABLE 1

| Pin | Function | Name |
|---|---|---|
| P1 | Input Voltage | $V_{IN}$ |
| P2 | Input Voltage | $V_{IN}$ |
| P3 | Input Voltage | $V_{IN}$ |
| P4 | Input Voltage | $V_{IN}$ |
| P5 | Boost Voltage | $V_{BOOST}$ |
| P6 | Current Trim | OCP |
| P7 | Frequency Adjust | Freq |
| P8 | No connection | N/C |
| P9 | User controlled turn on/off | Enable |
| P10 | Output Voltage Adjust | Trim |
| P11 | Positive Voltage Sense | $+V_S$ |
| P12 | No connection | N/C |
| P13 | Negative Voltage Sense | $-V_S$ |
| P14 | Negative Voltage Sense | $-V_S$ |
| P15 | Power Ground | $P_{GND}$ |
| P16 | Power Ground | $P_{GND}$ |
| P17 | Power Ground | $P_{GND}$ |
| P18 | Power Ground | $P_{GND}$ |
| P19 | Power Ground | $P_{GND}$ |
| P20 | Power Ground | $P_{GND}$ |
| P21 | Switch Voltage | $V_{SW}$ |
| P22 | Input Voltage | $V_{IN}$ |
| P23 | Negative Voltage Sense | $-V_S$ |

Figure 8:
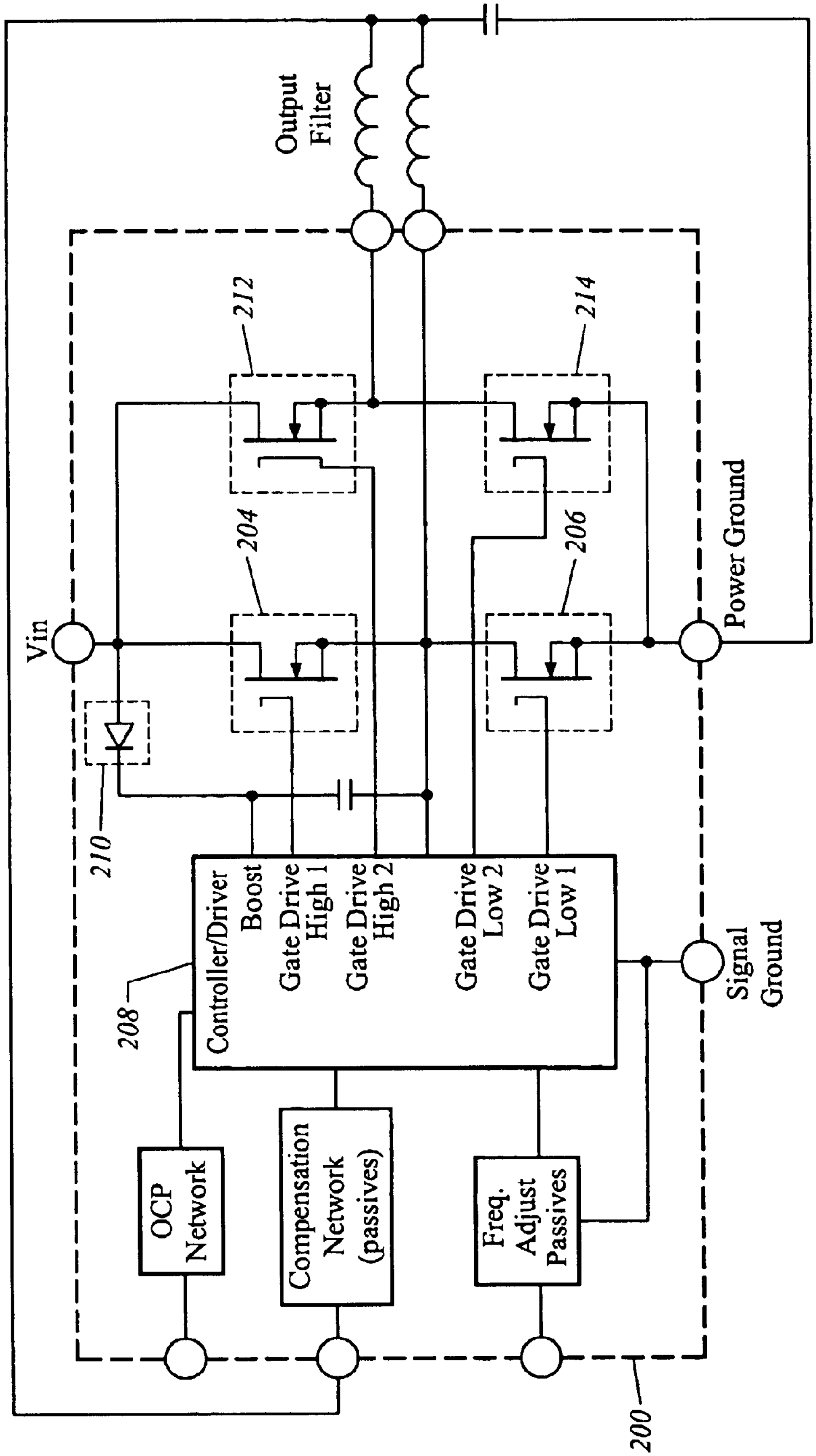
FIG. 8 is a schematic view of an alternative embodiment of the present invention.

FIG. 8 illustrates an electrical diagram of an alternative embodiment of the DC—DC converter provided in an LGA package 200. Unlike the embodiment of FIG. 4, this alternative embodiment comprises a DC—DC converter having two pairs of MOSFET dice adapted for parallel operation. As generally known in the art, parallel operation provides an output voltage $V_o$ with reduced voltage ripple.

As shown in FIG. 8, the DC—DC converter includes high side MOSFETS 204, 212, low side MOSFETS 206, 214, and an output filter provided by parallel inductors and a capacitor. The drain terminal of the high side MOSFET 204 is coupled to the input voltage $V_{in}$, the source terminal of the low side MOSFET 206 is connected to ground, and the source terminal of the high side MOSFET 204 and the drain terminal of the low side MOSFET 206 are coupled together to define a first phase node. A first inductor of the output filter is coupled in series between the first phase node and the terminal providing the output voltage $V_o$, and the capacitor of the output filter is coupled in parallel with the resistive load. Likewise, the drain terminal of the high side MOSFET 212 is coupled to the input voltage $V_{in}$, the source terminal of the low side MOSFET 214 is connected to ground, and the source terminal of the high side MOSFET 211 and the drain terminal of the low side MOSFET 214 are coupled together to define a second phase node. A second inductor of the output filter is coupled in series between the second phase node and the terminal providing the output voltage $V_o$, and the capacitor of the output filter is coupled in parallel with the resistive load. Each of the MOSFETs 204, 206, 212, 214 may be provided by separate semiconductor dice. The controller/driver provided by another semiconductor die 208 includes a pulse width modulation (PWM) circuit that controls the duty cycle of a square wave signal used to control the activation time of the MOSFETs 204, 206, 212, 214. Feedback signals reflecting the output voltage $V_o$ and/or current are provided to the controller/driver via a suitable compensation network to determine the duty cycle of the PWM signal. The opening and closing of the MOSFETs 204, 206 provides a first intermediate voltage having a generally rectangular waveform at the first phase node, and the opening and closing of the MOSFETs 212, 214 provides a second intermediate voltage having a generally rectangular waveform at the second phase node. The output filter formed by the inductors and capacitor converts the rectangular waveforms into the substantially DC output voltage $V_o$. The DC—DC converter may also include an over current protection (OCP) network, and passive devices used to determine the clock frequency for the PWM circuit, as generally known in the art.

As with the preceding embodiment, the majority of the heat created by the package is generated by the power semiconductor dice 204, 206, 212, 214. This heat must be dissipated efficiently from the power semiconductor dice 204, 206, 212, 214 to the external pads of the LGA.

Figure 9:
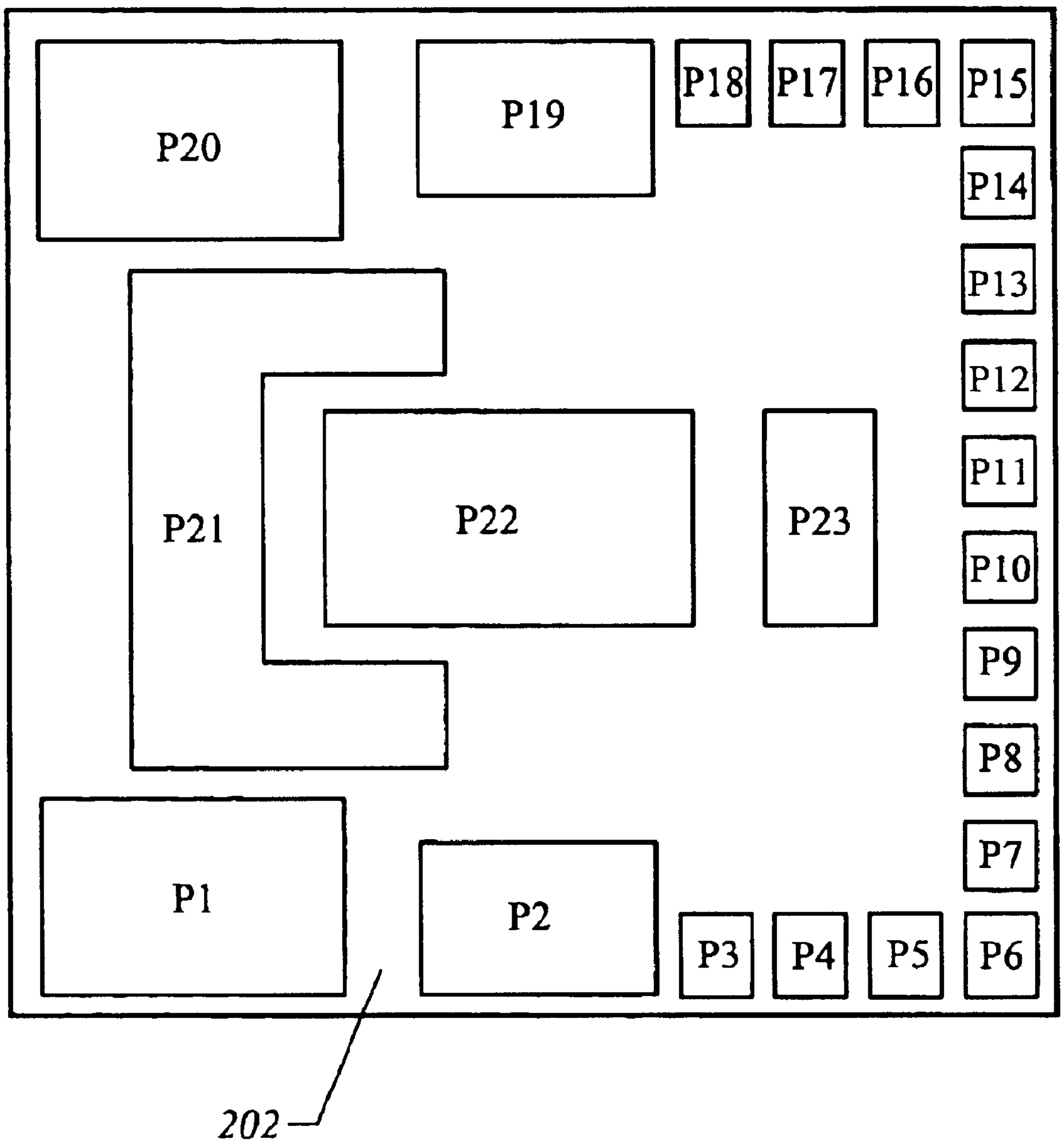
FIG. 9 is a bottom view of an alternative embodiment of the present invention, illustrating the pin-out assignments of the LGA package.

FIG. 9 illustrates an alternative embodiment of an arrangement of input pads on the substrate 202 of an LGA package, in accordance with the DC—DC converter of FIG. 8. The LGA is generally divided into two regions, including a first side region and a second side region. As shown in FIG. 8, the first side region encompasses the left side of the substrate's bottom surface and the second side region encompasses the right side of the bottom surface. The first side region includes a plurality of large input pads and the second side region includes a plurality of small input pads arrayed along the periphery of the LGA package. The I/O pin assignments that correlate with the external pad designations are as follows:

TABLE 2

| Pin | Function | Name |
|---|---|---|
| P1 | Input Voltage | $V_{IN}$ |
| P2 | Switch Voltage Phase 2 | $V_{SW2}$ |
| P3 | Power Good Flag | FLAG |
| P4 | Current Limit Adjust | OCP |
| P5 | User controlled turn on/off | Enable |
| P6 | Negative Voltage Sense | $-V_S$ |
| P7 | Negative Voltage Sense | $-V_S$ |
| P8 | Current Share | $I_{SHARE}$ |
| P9 | Phase/Synchronization | PHASE |
| P10 | Positive Voltage Sense | $+V_S$ |
| P11 | Output Voltage Adjust | Trim |
| P12 | Voltage Reference | $V_{REF}$ |
| P13 | Clock Signal | CLK |
| P14 | Power Ground | $P_{GND}$ |
| P15 | Power Ground | $P_{GND}$ |
| P16 | Power Ground | $P_{GND}$ |
| P17 | Power Ground | $P_{GND}$ |
| P18 | Power Ground | $P_{GND}$ |
| P19 | Switch Voltage | $V_{SW}$ |
| P20 | Input Voltage | $V_{IN}$ |
| P21 | Power Ground | $P_{GND}$ |
| P22 | Negative Voltage Sense | $-V_S$ |
| P23 | Negative Voltage Sense | $-V_S$ |

As shown in FIG. 9, the large input pads of the first side region are further arranged in a symmetrical pattern with large input pads P1 and P2 at a first end, large input pads P19 and P20 at a second end, and large input pads P21, P22 and P23 arranged therebetween. The large input pads P1, P2 at the first end are assigned to the input voltage $V_{IN}$ and first phase switch voltage $V_{SW1}$, and are located substantially directly beneath the semiconductor dice providing the first phase MOSFETs 204, 206, respectively. The large input pads P19, P20 at the second end are assigned to the input voltage $V_{IN}$ and second phase switch voltage $V_{SW2}$, and are located substantially directly beneath the semiconductor dice providing the second phase MOSFETs 212, 214, respectively. The external pads P3–P18 are dedicated for use by the discrete passive components. By disposing the largest heat generators at opposite sides of the LGA package, the heat is effectively spread across the substrate. The large input pads P21, P22 and P23 further provide surfaces for conduction of heat to the motherboard. It should be appreciated that it is within the spirit and scope of the present invention to modify the pin arrangements shown above.

It is well known that electronic components generate heat, and that, unless excess heat is drawn away from the components, the components can overheat, and possibly malfunction as a result. In many applications, the environment in the immediate vicinity of the components is nearly as hot as the components themselves, and, therefore, the heat will not dissipate naturally from the components. The description of the via design will be described with reference only to the power semiconductor die 104, but it is assumed that the description is applicable to any one of the power semiconductor dice in the present invention.

Figure 5:
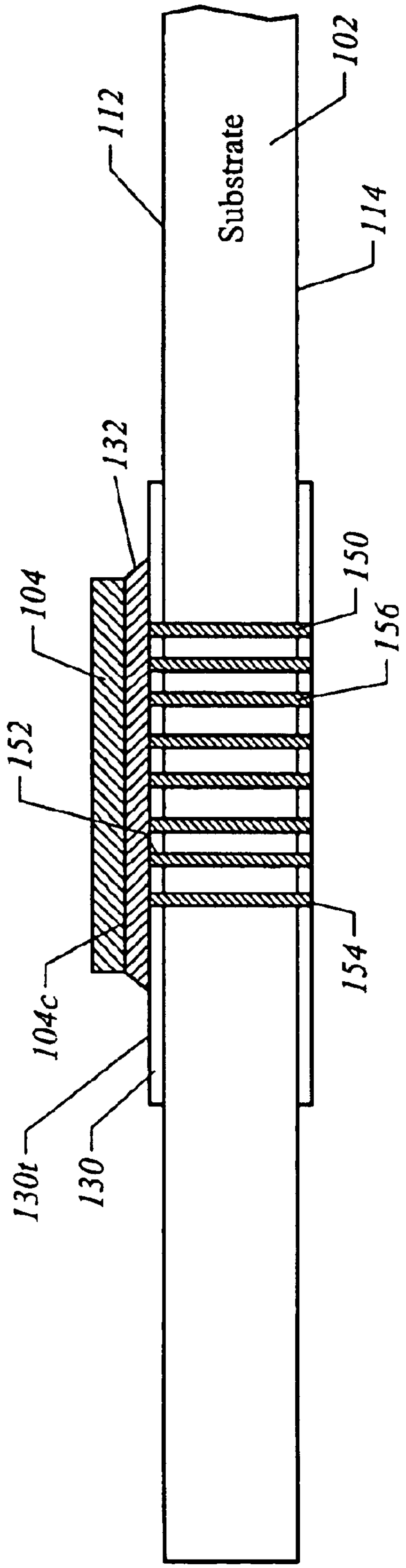
FIG. 5 is a side cut-away view of an embodiment of the present invention illustrating a power semiconductor die electrically and thermally coupled to a via array.

A substrate conventionally includes a plurality of vias that extend through the substrate, partially (e.g., multi-layer substrate) or completely (e.g., as shown in FIG. 5). A via is known within the art as a plated through hole. Each via 150 is created by copper plating an opening that extends partially or completely through the substrate 102. In a preferred embodiment, the vias 150 are filled with a thermally conductive material 156 to ensure electrical and thermal transport from the opposing metallized surface 104*c* of the power semiconductor die 104 to the external pad P22. The conductive material 156 is a material of good thermal conductivity to provide a via 150 with low thermal resistance. Not every via 150 must be filled or plugged with the material 156.

Filling each via 150 improves thermal conduction and eliminates the need for a solder mask on the die surface 112 of the substrate 102, thereby allowing the opposing metallized surface (drain electrode) of a power semiconductor die to electrically and thermally couple to the via 150 without requiring bond wires. This minimizes the thermal resistance between the power semiconductor die 104 and the external pad P22. Filling each via 150 also eliminates moisture entrapment in the package and enhances the thermal conduction through the via 150. The design, location, and via density does not affect the contact surface 130*t* of the die attach pad 130, which is preferably a planar surface to achieve the largest contact area possible between the contact surface 130*t* and an opposing metallized surface of a semiconductor die.

Filling each via 150 has several other advantages. For example, filling each via 150 will keep the processing and soldering chemicals out of the copper-plated via 150. The via plug or fill also electrically insulates the copper annular ring of the vias and minimize signal shorts. Solder wicking across each via 150 will also be prevented thereby eliminating shorts, especially underneath components. It is understood that not all of the vias 150 provide a low thermal impedance path between the opposing metallized surface of a power semiconductor die and an external pad located in the interior region IR of the LGA (e.g., P21, P22, or P23). Some vias 150 provide an electrical connection between a discrete passive component and one or more of the external pads located in the peripheral region PR (e.g., external pads P1-P20).

FIG. 5 illustrates a via array that provides multiple low thermal impedance paths between the opposing metallized surface 104*c* of the first power semiconductor die 104 and the external pad P22. In general, each via 150 includes two opposing ends—a first end 152 located proximate to the die attach pad 130 and a second end 154 located proximate to the bottom surface 114 of the substrate 102. As previously mentioned above, the inside walls of a via 150 are plated with electro-deposited copper of a specified thickness. The inner core of each via 150 shown in FIG. 5 is preferably filled with a sealing material, known as a via plug or via fill. The inner core of each via 150 may also be hollow. Regardless, each via 150 is preferably capped at the top and bottom with electro-deposited copper. Capping a via is conventionally known as "over-plating," which adheres to the top and bottom copper laminate of the substrate.

In general, the vias 150 perform two functions. First, the vias 150 provide outlets for thermal dissipation from the opposing metallized surface 104*c*. Second, the vias 150 provide an electrical connection between the power semiconductor die 104 and the external conduct pad P22. Thus, the vias 150 distributed underneath the power semiconductor die 104 act as conduits of heat in parallel, functioning simultaneously to draw heat away from all areas of the opposing metallized surface 104*c*. In this embodiment, the substrate 102 comprises two layers. Thus, each via 150 provides a single substantially vertical path through the substrate 102.

Figure 6:
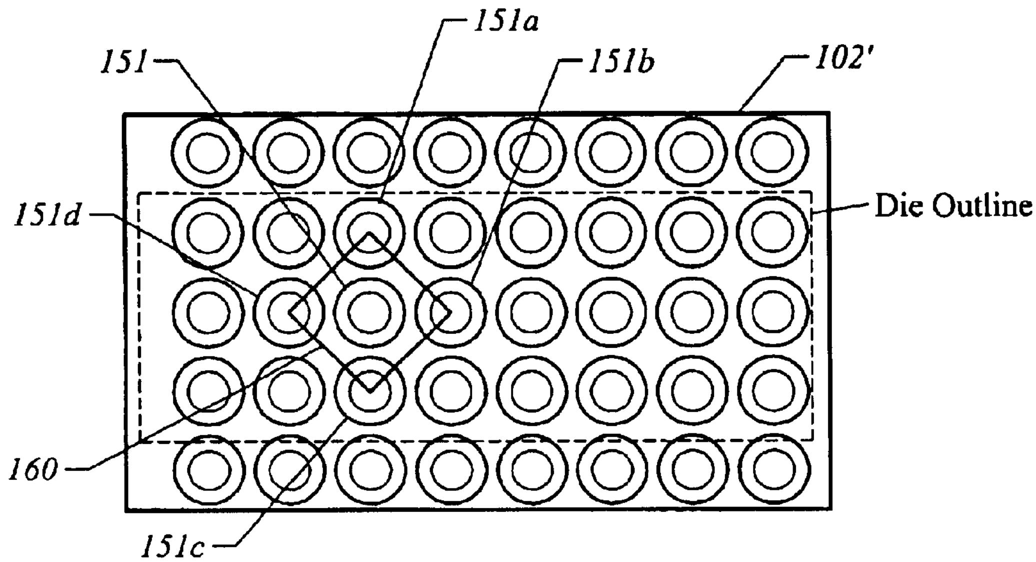
FIG. 6 is a top view of a via design according to the prior art.

FIG. 6 illustrates a conventional rectangular via array used to dissipate heat away from a component and through a substrate. In a rectangular arrangement, the extent to which a via may transfer heat to an adjacent via is demonstrated by an effective cell 160. In the via arrangement shown in FIG. 6, the effective cell 160 includes a center via 151 surrounded by four adjacent vias 151*a*, 151*b*, 151*c*, and 151*d*. Depending on the pitch of the vias 150, the heat flow path created between a power semiconductor die and an external pad of an LGA is either purely vertical, or, a combination of both horizontal and vertical paths. For example, if the vias 150 are spaced close enough to each other, each via 150 will transfer heat laterally to an adjacent via 150 while simultaneously channeling heat downward to the bottom surface 114 of the substrate 102 and to the customer board. In FIG. 6, the center via 150 may effectively transfer heat to each of the adjacent vias 151*a*, 151*b*, 151*c*, 151*d*. The amount of thermal cross-talk is dependant on the pitch and aspect ratio of the vias 150 as well as the material properties of the components in the vias 150. By way of example only, if the pitch (the spacing from the center of one via to an adjacent via) of each via is 0.3 mm, the area of the effective cell 160 is 0.32 mm2.

Figure 7:
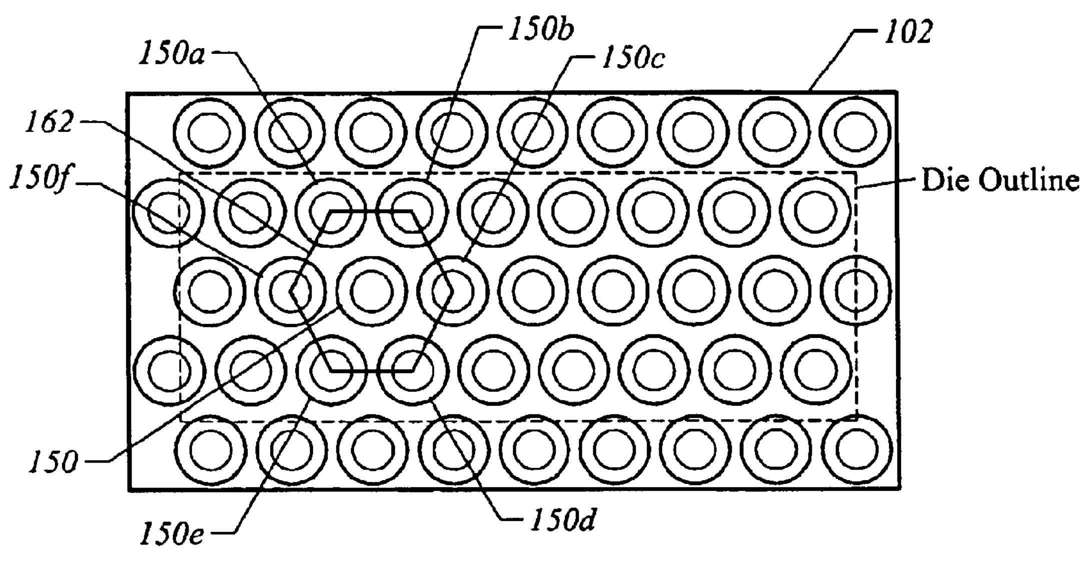
FIG. 7 is a top view of an embodiment of the present invention, illustrating a high-density via design.

The present invention provides an improvement over the conventional rectangular via array shown in FIG. 6. FIG. 7 illustrates an embodiment of a high-density via array of the present invention. FIG. 7 shows that the spacing of the vias 150 in relation to each other is staggered. The extent to which a via 150 may transfer heat to an adjacent via is demonstrated by an effective cell 162. The effective cell 162 includes a center via 150 surrounded by six adjacent vias 150*a*, 150*b*, 150*c*, 150*d*, 150*e*, and 150*f*. Thus, each center via 150 may effectively transfer heat to each of the six adjacent vias 150*a*, 150*b*, 150*c*, 150*d*, 150*e*, 150*f*, which creates a more heat efficient package.

Assuming that the pitch of each via 150 remains at 0.3 mm, the area of effective cell 162 increases to 0.48 sq mm—a 50% increase over the conventional rectangular via array. The high density via array thus increases the number of vias that can fit under a power semiconductor die. By way of example only, the high-density via array shown in FIG. 7 will include five more vias (considering layout restrictions stemming from other components on the substrate) beneath each semiconductor die. This represents a 12.5% increase in the number of vias that can dissipate heat from each power semiconductor die to the bottom surface of the substrate. The aggregate effect of the high-density via array shown in FIG. 7 translates to a 15% improvement in heat dissipation over the rectangular via pattern shown in FIG. 6.

The foregoing description of preferred embodiments of the present invention has been provided for the purposes of illustration and description. It is not intended to be exhaustive or to limit the invention to precise forms disclosed. Obviously, many modifications and variations will be apparent to practitioners skilled in the art. The embodiments were chosen and described in order to best explain the principles of the invention and its practical application, thereby enabling others skilled in the art to understand the invention for various embodiment and with various modifications as are suited to the particular use contemplated. It is intended that the scope of the invention be defined by the following claims and their equivalents.

What is claimed is:

1. A land grid array package, comprising:

a substrate having a top surface and a bottom surface;

a DC—DC converter provided on said substrate, said DC—DC converter including at least one power silicon die having a top electrode surface and a bottom electrode surface, said bottom electrode surface being coupled to top surface of said substrate; and a plurality of electrically and thermally conductive pads provided on said bottom surface of said substrate in electrical communication with said DC—DC converter through respective conductive vias, said plurality of pads including first pads having a first surface area and second pads having a second surface area, said second surface area being substantially larger than said first surface area;

wherein, heat generated by said DC—DC converter is conducted out of said land grid array package through said plurality of pads.

2. The land grid array package of claim 1, wherein said at least one power silicon die comprises at least one power MOSFET device.

3. The land grid array package of claim 1, wherein said at least one power silicon die is substantially aligned with at least one of said second pads.

4. The land grid array package of claim 1, wherein said first pads are substantially located in a peripheral region of said bottom surface.

5. The land grid array package of claim 4, wherein said second pads are substantially located in an interior region of said bottom surface.

6. The land grid array package of claim 1, wherein said first pads are substantially located at a first side of said bottom surface.

7. The land grid array package of claim 6, wherein said second pads are substantially located at a second side of said bottom surface.

8. The land grid array package of claim 1, wherein said at least one power silicon die further comprises a high side MOSFET device and a low side MOSFET device.

9. The land grid array package of claim 1, wherein said at least one power silicon die further comprises a first pair of MOSFET devices and a second pair of MOSFET devices.

10. The land grid array package of claim 9, wherein said first pair of MOSFET devices are substantially aligned with a first corresponding pair of second pads disposed adjacent a first side of said bottom surface, and said second pair of MOSFET devices are substantially aligned with a second corresponding pair of second pads disposed adjacent a second side of said bottom surface.

11. The land grid array package of claim 1, wherein said substrate comprises a plurality of die attach pads provided on said top surface, said at least one power semiconductor die being mounted to a corresponding one of said plurality of die attach pads.

12. The land grid array package of claim 1, wherein said DC—DC converter further comprises a plurality of discrete passive components electrically coupled to said at least one power semiconductor die.

13. The land grid array package of claim 1, further comprising a plurality of vias extending through said substrate, each one of said plurality of vias having a first end located proximate to said at least one power semiconductor die and a second end located proximate to one of said second pads.

14. The land grid array package of claim 13, wherein said plurality of vias are arranged in an array located beneath said at least one power semiconductor die.

15. The land grid array package of claim 14, wherein said array is electrically and thermally coupled to said at least one power semiconductor die and said one of said second pads.

16. The land grid array package of claim 1, wherein said DC—DC converter further comprises a buck converter.

17. The land grid array package of claim 1, wherein said DC—DC converter further comprises a two-phase buck converter.

* * * * *